United States Patent
Chang

(10) Patent No.: US 12,094,921 B2
(45) Date of Patent: Sep. 17, 2024

(54) SEMICONDUCTOR DEVICE INCLUDING THREE-DIMENSIONAL INDUCTOR STRUCTURE AND METHOD OF FORMING THE SAME

(71) Applicant: RichWave Technology Corp., Taipei (TW)

(72) Inventor: Chia-Wie Chang, Taipei (TW)

(73) Assignee: RichWave Technology Corp., Taipei (TW)

(*) Notice: Subject to any disclaimer, the term of this patent is extended or adjusted under 35 U.S.C. 154(b) by 145 days.

(21) Appl. No.: 17/408,485

(22) Filed: Aug. 23, 2021

(65) Prior Publication Data
US 2023/0006029 A1  Jan. 5, 2023

(30) Foreign Application Priority Data
Jun. 30, 2021 (TW) ................................ 110124062

(51) Int. Cl.
*H01L 21/768* (2006.01)
*H01L 21/66* (2006.01)
(Continued)

(52) U.S. Cl.
CPC ........ *H01L 28/10* (2013.01); *H01L 21/76898* (2013.01); *H01L 22/12* (2013.01); *H01L 23/481* (2013.01); *H01L 27/0688* (2013.01)

(58) Field of Classification Search
CPC ... H01L 28/10; H01L 21/76898; H01L 22/12; H01L 23/481; H01L 27/0688;
(Continued)

(56) References Cited

U.S. PATENT DOCUMENTS 5,095,357 A    3/1992  Andoh
2004/0212034 A1* 10/2004 Mochizuki ............. H01L 24/02
                                                          257/E29.189
(Continued)

FOREIGN PATENT DOCUMENTS

CN      1515026 A     7/2004
CN    103985698 A     8/2014
(Continued)

OTHER PUBLICATIONS

Chang, the specification, including the claims, and drawings in the U.S. Appl. No. 17/990,733, filed Nov. 20, 2022.
(Continued)

*Primary Examiner* — Herve-Louis Y Assouman
(74) *Attorney, Agent, or Firm* — Winston Hsu

(57) ABSTRACT

A semiconductor device includes a compound substrate, at least one front side pattern, at least one backside pattern and at least one through-wafer via structure. The compound substrate includes a front side and a backside. The at least one front side pattern is arranged on the front side of the compound substrate. The at least one backside pattern is arranged on the backside of the compound substrate. The least one through-wafer via structure penetrates the compound substrate from the front side to the backside. The at least one front side pattern, the at least one backside pattern and the at least one through-wafer form a three-dimensional inductor structure.

17 Claims, 3 Drawing Sheets

(51) Int. Cl.
   *H01L 23/48*   (2006.01)
   *H01L 23/522*  (2006.01)
   *H01L 23/64*   (2006.01)
   *H01L 27/06*   (2006.01)
   *H01L 49/02*   (2006.01)

(58) Field of Classification Search
   CPC .............. H01L 23/645; H01L 23/5227; H01L 21/76816; H01F 2017/002; H01F 2017/0086; H01F 17/0013
   See application file for complete search history.

(56) References Cited

U.S. PATENT DOCUMENTS

| | | |
|---|---|---|
| 2004/0217440 A1 | 11/2004 | Ng |
| 2010/0210299 A1 | 8/2010 | Gorbachov |
| 2013/0005109 A1 | 1/2013 | Dao |
| 2014/0209926 A1 | 7/2014 | Takatani |
| 2014/0247269 A1 | 9/2014 | Berdy |
| 2015/0035162 A1* | 2/2015 | Lan .................. H01L 28/10 716/110 |
| 2016/0020013 A1* | 1/2016 | Berdy ............... H01F 27/2804 336/200 |
| 2017/0330940 A1* | 11/2017 | Lee ................. H01L 29/66462 |
| 2020/0304089 A1* | 9/2020 | Joshi ................. H01L 28/10 |
| 2021/0099149 A1 | 4/2021 | Lan |
| 2022/0014176 A1* | 1/2022 | Lan .................. H03H 1/00 |

FOREIGN PATENT DOCUMENTS

| | | |
|---|---|---|
| CN | 109889168 A | 6/2019 |
| TW | 200824094 | 6/2008 |
| TW | 201023299 A1 | 6/2010 |
| TW | 201108387 A1 | 3/2011 |
| TW | 201135803 A1 | 10/2011 |
| TW | 201222762 A1 | 6/2012 |
| TW | 201351457 A | 12/2013 |
| TW | 201428433 A | 7/2014 |
| TW | 201528501 A | 7/2015 |
| TW | 201543559 A | 11/2015 |
| TW | 201543641 A | 11/2015 |
| TW | 201642370 A | 12/2016 |
| TW | 201707199 A | 2/2017 |
| TW | M557453 U | 3/2018 |
| TW | 201901916 | 1/2019 |
| TW | 202109822 A | 3/2021 |
| WO | 2022/010576 A1 | 1/2022 |

OTHER PUBLICATIONS

Office action mailed on Jul. 4, 2023 for the Taiwan application No. 110124062, filing date Jun. 30, 2021, p. 1-21., Jul. 4, 2023.
Office action mailed on Sep. 23, 2023 for the Taiwan application No. 111137093, filing date Sep. 29, 2022, p. 1-4. ,Sep. 23, 2023.
Office action mailed/issued on Nov. 6, 2023 for TW application No. 110124062, filing date: Jun. 30, 2021, pp. 1-17. ,Nov. 6, 2023.
Office action mailed on May 23, 2024 for the U.S. Appl. No. 17/990,733, filed Nov. 20, 2022, pp. 1-38.

* cited by examiner

SEMICONDUCTOR DEVICE INCLUDING THREE-DIMENSIONAL INDUCTOR STRUCTURE AND METHOD OF FORMING THE SAME

CROSS REFERENCE TO RELATED APPLICATION

This non-provisional application claims priority of Taiwan patent application No. 110124062, filed on 30 Jun. 2021, included herein by reference in its entirety.

TECHNICAL FIELD

The present invention relates to semiconductors, and in particular, to a semiconductor device including a three-dimensional inductor structure and a method of forming the semiconductor device.

BACKGROUND

Group III-V semiconductors and Group II-VI semiconductors have excellent material properties such as a high operating speed and a high power output, being suitable for fabricating communication devices. In radio frequency circuits of the communication devices, integrated passive devices (IPDs) such as inductors have many uses in, for example, matching networks or inductor-capacitor (LC) resonators. However, in the related art, an inductor usually takes up a large circuit area, being unfavorable for a size reduction of the communication devices, and increasing manufacturing cost.

SUMMARY

According to an embodiment of the invention, a semiconductor device includes a compound substrate, at least one front side pattern, at least one backside pattern and at least one through-wafer via structure. The compound substrate includes a front side surface and a backside surface. The at least one front side pattern is disposed on the front side surface of the compound substrate. The at least one backside pattern is disposed on the backside of the compound substrate. The at least one through-wafer via structure penetrates the compound substrate from the front side surface to the backside surface. The at least one front side pattern, the at least one backside pattern, and the at least one through-wafer via structure form a three-dimensional inductor structure.

According to another embodiment of the invention, A method of forming a semiconductor device includes forming at least one front side pattern on a front side surface of a compound substrate, forming a front side surface protection layer on the at least one front side pattern, thinning the compound substrate to form a backside surface of one of the compound substrate, drilling the compound substrate from the backside surface to form at least one through-wafer via, electroplating the at least one through-wafer via and the backside surface of the compound substrate to form an electroplating layer, and etching the electroplated layer to form at least one backside pattern.

DETAILED DESCRIPTION

Figure 1:
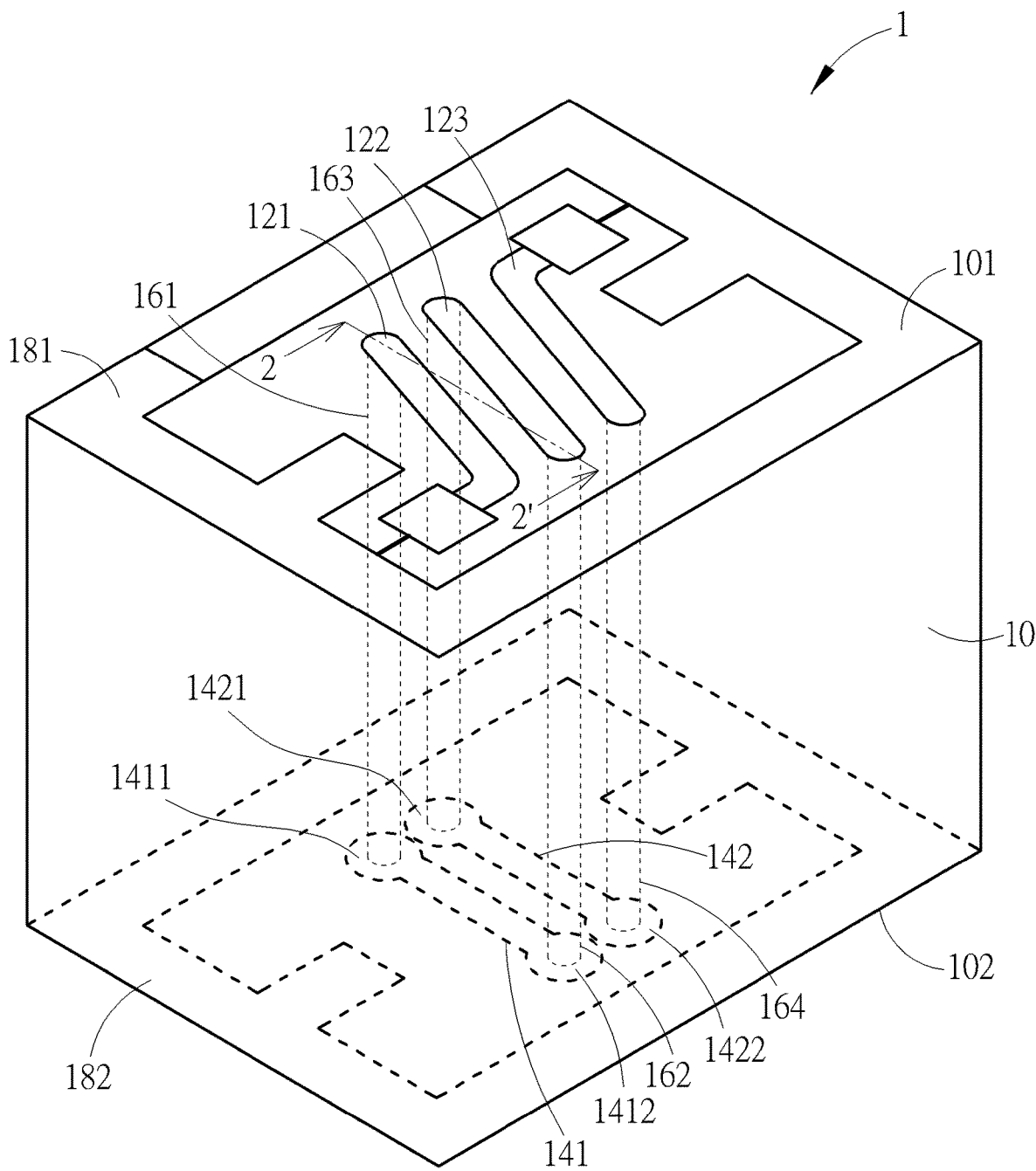
FIG. 1 is a schematic diagram of a semiconductor device according to an embodiment of the invention.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

FIG. 1 is a schematic diagram of a semiconductor device 1 according to an embodiment of the invention. The semiconductor device 1 may be a Group III-V semiconductor device or a Group II-VI semiconductor device. The semiconductor device 1 may include an integrated passive device (IPD). The integrated passive device may be an inductor. In some embodiments, the integrated passive device may be an inductor, a capacitor, a resistor, other circuits, or a combination thereof. The semiconductor device 1 utilizes front side structures, through-wafer via structure and backside structures of a compound substrate to form an integrated passive device, thereby saving circuit area and enhancing circuit performance.

In FIG. 1, the semiconductor device 1 includes a compound substrate 10, front side patterns 121 to 123, backside patterns 141 and 142, and through-wafer via structures 161 to 164. The compound substrate 10 includes a front side surface 101 and a backside surface 102. The front side patterns 121 to 123 are disposed on the front side surface 101 of the compound substrate 10. The backside patterns 141 and 142 are disposed on the backside surface 102 of the compound substrate 10. The through-wafer via structures 161 to 164 penetrate the compound substrate 10 from the front side surface 101 to the backside surface 102. The front side patterns 121 to 123, the backside patterns 141 and 142, and the through-wafer via structures 161 to 164 form a three-dimensional inductor structure. For example, the three-dimensional inductor structure may be fabricated using an integrated passive device (IPD) process, a heterojunction bipolar transistor (HBT) process, or a high electron mobility transistor (HEMT) process.

In some embodiments, the compound substrate 10 may be a Group III-V semiconductor substrate or a Group II-VI semiconductor substrate. For example, the compound substrate 10 may be a gallium arsenic (GaAs), gallium nitride (GaN) or gallium phosphide (GaP) semiconductor substrate.

In the embodiment, the front side patterns 121 to 123 may include three front side conductive paths. The backside patterns 141 and 142 may include two backside conductive paths. The through-wafer via structures 161 to 164 may have inductive properties, and the through-wafer via structures 161 to 164 may connect the three front side conductive paths and the two backside conductive paths to form a continuous conductive path. In the embodiment, an electromagnetic direction of the continuous conductive path may be parallel to an electromagnetic direction of the front side surface 101 of the compound substrate 10. The magnetic flux generated by the three-dimensional inductor structure may be parallel to the front side surface 101 of the compound substrate 10. In the embodiment, the front side patterns 121 to 123 and the backside patterns 141 and 142 may have a straight-line shape. In some embodiments, the front side patterns 121 to 123, the backside patterns 141 and 142, and the through-wafer via structures 161 to 164 may be curved in shape. For example, the front side patterns 121 to 123, the backside patterns 141 and 142, and the through-wafer via structures 161 to 164 may be of arc-shaped. In some embodiments, the magnetic flux generated by the three-dimensional inductor structure may be perpendicular to the front side surface 101 of the compound substrate 10.

As shown in FIG. 1, the three front side conductive paths may include a first front side conductive path, a second front side conductive path, and a third front side conductive path. The two backside conductive paths include a first backside conductive path and a second backside conductive path. The through-wafer via structures 161 to 164 include a first through-wafer via structure, a second through-wafer via structure, a third through-wafer via structure, and a fourth through-wafer via structure. The first front side conductive path is coupled to the first backside conductive path via the first through-wafer via structure, the first backside conductive path is coupled to the second front side conductive path via the second through-wafer via structure, the second front side conductive path is coupled to the second backside conductive path via the third through-wafer via structure, and the second backside conductive path is coupled to the third front side conductive path via the fourth through-wafer via structure. A tail end of the first front side conductive path is aligned with a head end 1411 of the first backside conductive path, a head end of the second front side conductive path is aligned with a tail end 1412 of the first backside conductive path, a tail end of the second front side conductive path is aligned with a head end 1421 of the second backside conductive path, and a head end of the third front side conductive path is aligned with a tail end 1422 of the second backside conductive path.

The semiconductor device 1 may further include a front side pattern 181 and a backside pattern 182. The front side pattern 181 may be a connection line connecting the front side patterns 121, 123 and an external circuit. The backside pattern 182 may be a ground wire or a ground plane. In some embodiments, the semiconductor device 1 may further include an active circuit disposed on the compound substrate 10. For example, the active circuit may include an amplifier circuit, a low-noise amplifier circuit, or a switch. The front side patterns 121 and 123 may be coupled to the active circuit via the front side pattern 181.

While FIG. 1 shows that the three-dimensional inductor structure only includes the front side patterns 121 to 123, the backside patterns 141 and 142, and the through-wafer via structures 161 to 164, in other embodiments, the three-dimensional inductor structure may include other numbers of front side patterns, backside patterns, and through-wafer via structures.

Figure 2:
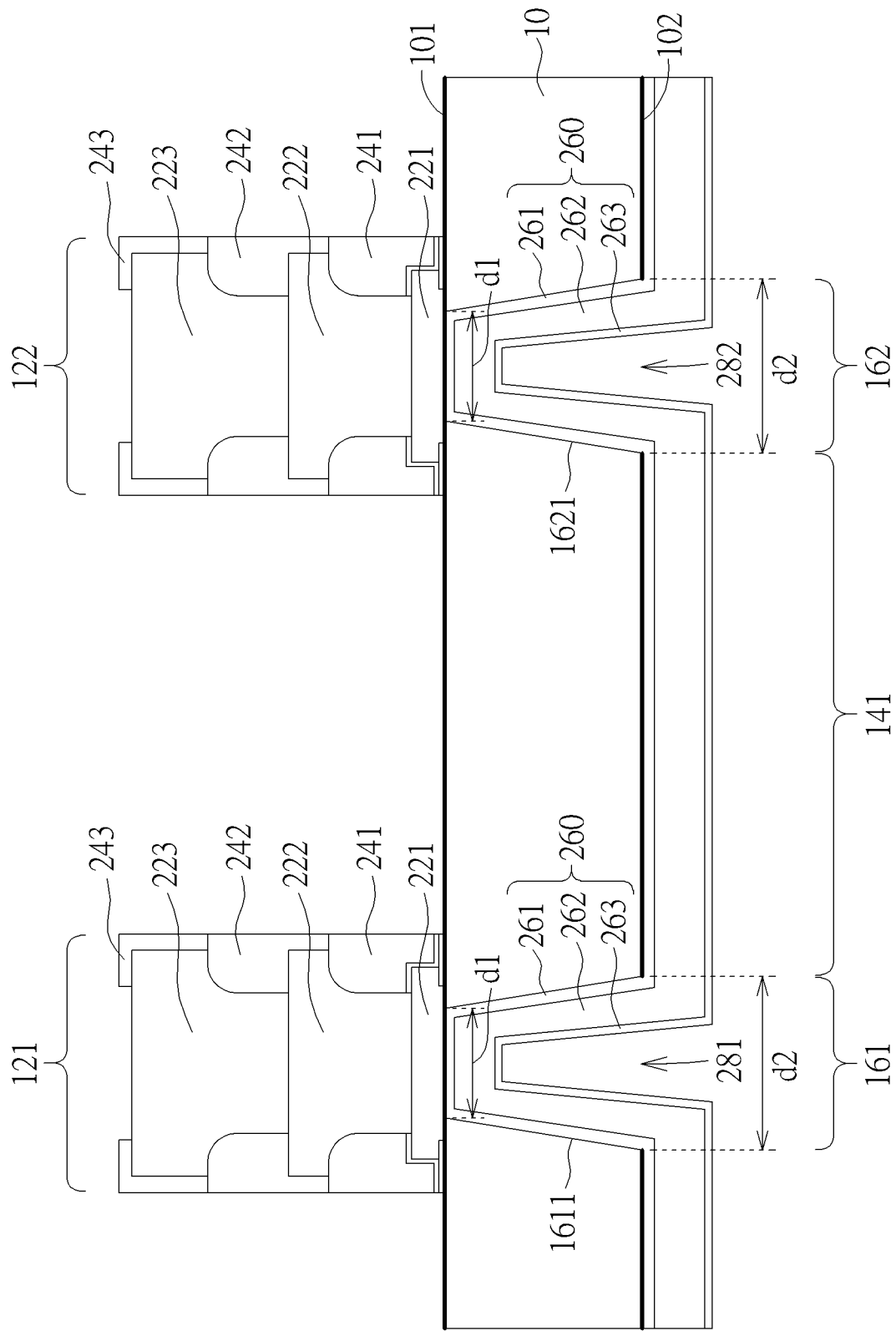
FIG. 2 is a cross-sectional view of the semiconductor device in FIG. 1 along the line 2-2'.

FIG. 2 is a cross-sectional view of the semiconductor device 1 in FIG. 1 along the line 2-2'. In the embodiment, the thickness of the compound substrate 10 may be 100 micrometers. The front side patterns 121 to 123 may be made of one or more front side metal layers. The backside patterns 141 and 142 may be made of corresponding portions of one or more backside metal layers. Increasing the total thickness of the front side metal layers and/or the backside metal layers may improve a quality factor of an inductor of the three-dimensional inductor structure and enhance an inductance characteristics. The through-wafer via structures 161 to 164 may be made of corresponding portions of the one or more backside metal layers and recesses. FIG. 2 shows that the front side patterns 121 and 122 are made of front side metal layers 221 to 223, the backside pattern 141 is made of a corresponding portion of the backside metal layer 260, the through-wafer via structure 161 is made of a corresponding portion of the backside metal layer 260 and a recess 281, and the through-wafer via structure 162 is made of a corresponding portion of the backside metal layer 260 and a recess 282. The backside metal layer 260 may include the corresponding portion of the through-wafer via structure 161, the corresponding portion of the back-side pattern 141, and the corresponding portion of the through-wafer via structure 162.

In some embodiments, the front side metal layers 221 to 223 may be different in thicknesses, and may be made of the same or different metal materials. For example, in some embodiments, the front side metal layers 221 to 223 may be made of copper, the thickness of the front side metal layer 221 may be 1 micrometer, the thickness of the front side metal layer 222 may be 2 micrometers, and the thickness of the front side metal layer 223 may be 2 micrometers. In other embodiments, the front side metal layers 221 to 223 may be all made of gold. The front side patterns 121 to 123 may be covered by the front side protection layers 241 to 243, respectively, and the front side protection layers 241 to 243 may be made of a nitride or a polymide.

The backside metal layer 260 may include backside metal layer portions 261 to 263, and the backside metal layer portions 261 to 263 may be different in thicknesses, and may be made of the same or different metal materials. For example, the backside metal layer portion 261 may be made of gold and the thickness thereof may be 1 micrometer; the backside metal layer portion 262 may be made of copper and the thickness thereof may be 7 micrometers; the backside metal layer portion 263 may be made of gold and the thickness thereof may be 2 micrometers. In some embodiments, the backside metal layer portions 261 to 263 may be all made of gold. In some embodiments, the total thickness of the backside metal layer 260 may be less than 20 micrometers. For example, the total thickness of the backside metal layer 260 may be 10 micrometers.

The corresponding portions of the through-wafer via structures 161 to 164 of the backside metal layer 260 may be sequentially and conformally formed on wall surfaces of the through-wafer via structures 161 to 164. For example, the corresponding portion of the through-wafer via structure 161 of the backside metal layer 260 may be sequentially and conformally formed on a wall surface 1611 of the through-wafer via structure 161, and the corresponding portion of the through-wafer via structure 162 of the backside metal layer 260 may be sequentially and conformally formed on a wall surface 1621 of the through-wafer via structure 162.

In some embodiments, the shape of the wafer via structures 161 to 164 may be conical, and each may include a first via end and a second via end. The first via end has a first diameter d1 and a first surface, and the second via end has a second diameter d2 and a second surface. Each first surface is in contact with the front side pattern, and each second surface is in contact with the backside pattern. Each first diameter d1 may be less than a corresponding second diameter d2, and each first surface may be less than a corresponding second surface. FIG. 2 shows that a first surface of a first via end of the through-wafer via structure 161 is in contact with the front side pattern 121, a second surface of a second via end of the through-wafer via structure 161 is in contact with the backside pattern 141. The first surface of the first via end of the through-wafer via structure 161 is smaller in area than the second surface of the second via end of the through-wafer via structure 161. A first diameter d1 of the first via end of the through-wafer via structure 161 is less than a second diameter d2 of the second via end of the through-wafer via structure 161. A first surface of a first via end of the through-wafer via structure 162 is in contact with the front side pattern 122, a second surface of a second via end of the through-wafer via structure 162 is in contact with the backside pattern 141. The first surface of the first via end of the through-wafer via structure 162 is smaller in area than the second surface of the second via end of the through-wafer via structure 162. A first diameter d1 of the first via end of the through-wafer via structure 162 is less than a second diameter d2 of the second via end of the through-wafer via structure 162. For example, in some exemplary embodiments the first diameters d1 of the first via ends of the through-wafer via structures 161 and 162 may be 35 micrometers, and the second diameters d2 of the second via ends of the through-wafer via structures 161 and 162 may be 70 micrometers.

Since the three-dimensional inductor structure is formed by the front side patterns 121 to 123, the backside patterns 141 and 142, and the through-wafer via structures 161 to 164, the through-wafer via structures 161 to 164 and the backside patterns 141 and 142 also contribute to the inductance. In comparison to the conventional IPD structure, the three-dimensional inductor structure of the present disclosure occupies less circuit area while achieving the same inductance. In addition, since the three-dimensional inductor structure may include the plurality of front side metal layers of the front side patterns 121 to 123, the plurality of backside metal layers of the backside patterns 141 and 142, and the plurality of backside metal layers on the wall surfaces of the through-wafer via structures 161 to 164, the eddy current may be effectively reduced and the quality factor of the inductor is increased considerably.

Figure 3:
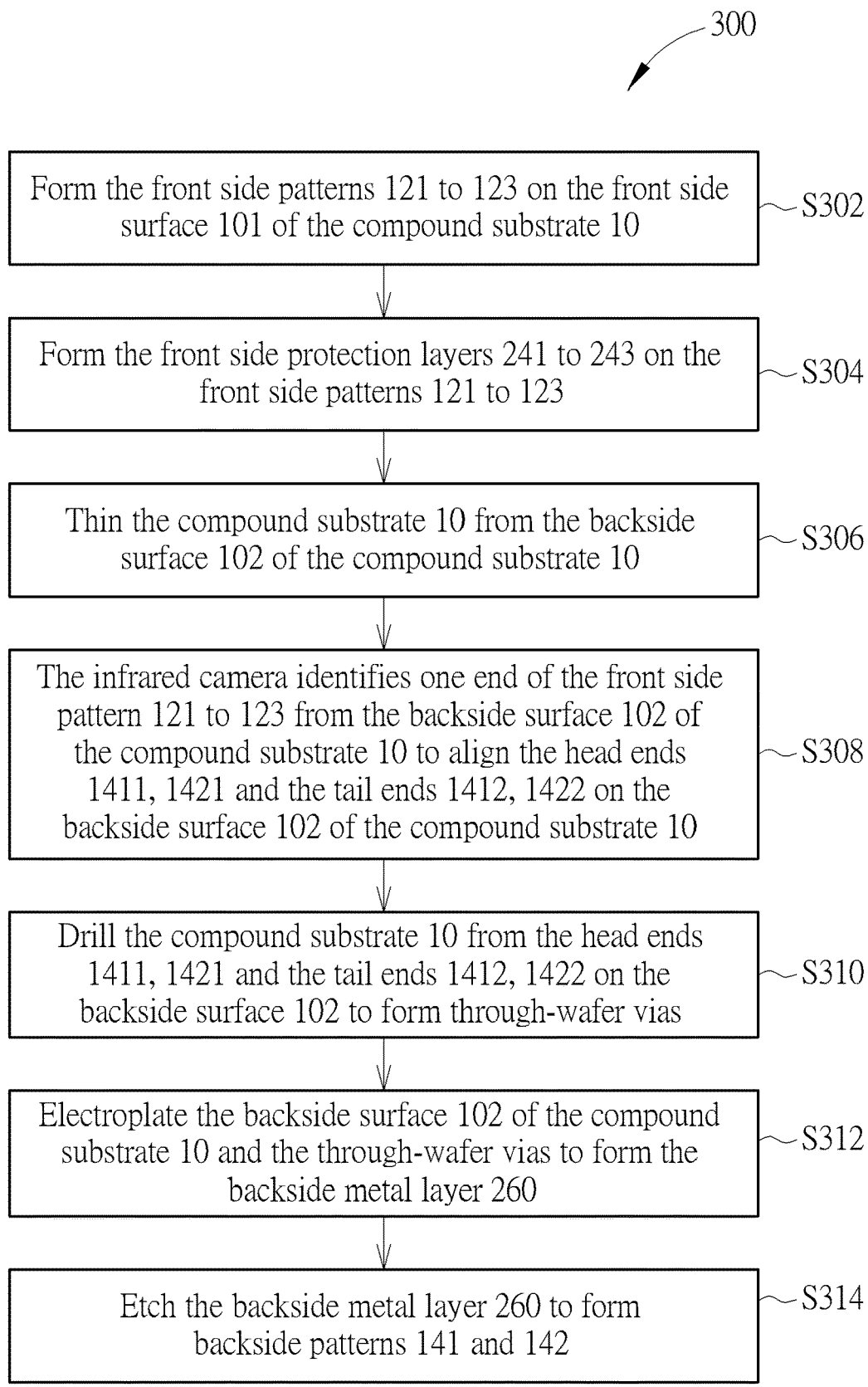
FIG. 3 is a flowchart of a method of forming the semiconductor device in FIG. 1.

FIG. 3 is a flowchart of a method 300 of forming the semiconductor device 1 in FIG. 1. The method 300 includes Steps S302 to S314. Steps S302 and S304 are used to form the front side patterns 121 to 123 and the front side protection layers 241 to 243. Steps S306 to S310 are used to form through-wafer vias. Steps S312 and S314 are used to form the backside patterns 141 and 142. Any reasonable step change or adjustment is within the scope of the present disclosure. Steps S302 to S314 are detailed as follows:

Step S302: Form the front side patterns 121 to 123 on the front side surface 101 of the compound substrate 10;

Step S304: Form the front side protection layers 241 to 243 on the front side patterns 121 to 123;

Step S306: Thin the compound substrate 10 from the backside surface 102 of the compound substrate 10;

Step S308: The infrared camera identifies one end of the front side pattern 121 to 123 from the backside surface 102 of the compound substrate 10 to align the head ends 1411, 1421 and the tail ends 1412, 1422 on the backside surface 102 of the compound substrate 10;

Step S310: Drill the compound substrate 10 from the head ends 1411, 1421 and the tail ends 1412, 1422 on the backside surface 102 to form through-wafer vias;

Step S312: Electroplate the backside surface 102 of the compound substrate 10 and the through-wafer vias to form the backside metal layer 260;

Step S314: Etch the backside metal layer 260 to form backside patterns 141 and 142.

In Steps S302 and S304, if the front side patterns 121 to 123 are made of N front side metal layers, N being a positive integer, a corresponding number of front side protection layers will be formed on each front side metal layer. For example, the front side patterns 121 to 123 are made of the front side metal layers 221 to 223, and the corresponding front side protection layers 241 to 243 are formed on the front side metal layers 221 to 223, respectively. In Step S306, the compound substrate 10 is thinned to a predetermined thickness, so that the compound substrate 10 can carry the front side patterns 121 to 123 properly without being affected by the stress, while light being able to pass through the compound substrate 10 for aligning with the front side patterns 121 to 123 from the backside surface 102. The predetermined thickness may be between 100 micrometers and 75 micrometers. In Step S308, as in FIG. 1, the tail end of the front pattern 121 corresponds to a position of the head end 1411, the head end of the front pattern 122 corresponds to a position of the tail end 1412, the tail end of the front pattern 122 corresponds to a position of the head end 1421, and the head end of the front pattern 123 corresponds to a position of the tail end 1422. In Step S310, since a through-wafer via is drilled from the backside surface 102 of the compound substrate 10, the second diameter d2 of the through-wafer via would exceed the first diameter d1 of the through-wafer. In Step S312, the backside surface 102 of the compound substrate 10 and the through-wafer vias are simultaneously electroplated to form the backside metal layer (electroplated layer) 260 on the backside surface 102 and the wall surfaces of the through-wafer vias. In Step S314, after the backside metal layer 260 is formed, a photoresist is coated, dried, and then the infrared camera is used to align a photomask with the front side patterns 121 to 123, followed by exposure and development, etching, and then removing the photoresist to form the desired backside patterns 141 and 142. The etching technique may be dry etching of removing unwanted portions of the backside metal layers 261 to 263 to form the backside patterns 141 and 142.

The method 300 may form the three-dimensional inductor structure of the semiconductor device 1 on a gallium arsenide substrate, reducing the circuit area of the inductor and enhancing the quality factor of the inductor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a compound substrate comprising a front side surface and a backside surface;
   at least one front side pattern disposed on the front side surface of the compound substrate, wherein the at least one front side pattern comprises a head end and a tail end;
   at least one backside pattern disposed on the backside surface of the compound substrate; and
   at least one through-wafer via structure penetrating the compound substrate from the front side surface to the backside surface;
   wherein the at least one front side pattern, the at least one backside pattern, and the at least one through-wafer via structure form a three-dimensional inductor structure; and
   the least one front side pattern comprises a plurality of front side metal layers, the plurality of front side metal layers being stacked together and each of the plurality of front side metal layers extending from the head end to the tail end.

2. The semiconductor device of claim 1, wherein the compound substrate is a Group III-V semiconductor substrate or a Group II-VI semiconductor substrate.

3. The semiconductor device of claim 1, wherein the compound substrate is a gallium arsenide semiconductor substrate.

4. The semiconductor device of claim 1, wherein the at least one backside surface pattern is made of a backside metal layer.

5. The semiconductor device of claim 1, wherein the at least one through-wafer via structure has an inductive characteristic.

6. The semiconductor device of claim 1, wherein:
the at least one front side pattern comprises a plurality of front side conductive paths;
the at least one backside pattern comprises a plurality of backside conductive paths; and
the at least one through-wafer via structure connects the front side conductive paths and the backside conductive paths to form a continuous conductive path.

7. The semiconductor device of claim 6, wherein:
the plurality of front side conductive paths comprises a first front side conductive path, a second front side conductive path, and a third front side conductive path;
the at least one through-wafer via structure comprises a first through-wafer via structure, a second through-wafer via structure, a third through-wafer via structure, and a fourth through-wafer via structure;
the plurality of backside conductive paths comprises a first backside conductive path and a second backside conductive path;
the first front side conductive path is coupled to the first backside conductive path via the first through-wafer via structure;
the second front side conductive path is coupled to the first backside conductive path via the second through-wafer via structure, and to the second backside conductive path via the third through-wafer via structure; and
the third front side conductive path is coupled to the second backside conductive path via the fourth through-wafer via structure.

8. The semiconductor device of claim 7, wherein:
a tail end of the first front side conductive path is aligned with a head end of the first backside conductive path;
a head end of the second front side conductive path is aligned with a tail end of the first backside conductive path;
a tail end of the second front side conductive path is aligned with a head end of the second backside conductive path; and
a head end of the third front side conductive path is aligned with a tail end of the second backside conductive path.

9. The semiconductor device of claim 6, wherein an electromagnetic direction of the continuous conductive path is parallel to the front side surface of the compound substrate.

10. The semiconductor device of claim 1, further comprising an active circuit disposed on the compound substrate.

11. The semiconductor device of claim 10, wherein the active circuit includes an amplifier circuit, a low-noise amplifier circuit or a switch.

12. The semiconductor device of claim 1, wherein the three-dimensional inductor structure is fabricated using an integrated passive device (IPD) process, a heterojunction bipolar transistor (HBT) process, or a high electron mobility transistor (HEMT) process.

13. The semiconductor device of claim 1, wherein the at least one front side pattern and the at least one backside pattern have a straight-line shape.

14. The semiconductor device of claim 1, wherein the at least one front side pattern, the at least one backside pattern and the at least one through-wafer via structure are curved in shape.

15. The semiconductor device of claim 1, wherein the three-dimensional inductor structure generates a magnetic flux parallel to the compound substrate.

16. The semiconductor device of claim 1, wherein the three-dimensional inductor structure generates a magnetic flux perpendicular to the front side surface of the compound substrate.

17. The semiconductor device of claim 1, wherein the at least one through-wafer via structure comprises:
a first via end having a first diameter and a first surface, the first surface being in contact with the at least one front side pattern;
a second via end having a second diameter and a second surface, and the second surface being in contact with the at least one backside pattern;
the first diameter is less than the second diameter; and
the first surface is less than the second surface.

* * * * *